US 6,573,183 B2
Jun. 3, 2003

(54) METHOD AND APPARATUS FOR CONTROLLING CONTAMINATION DURING THE ELECTROPLATING DEPOSITION OF METALS ONTO A SEMICONDUCTOR WAFER SURFACE

(75) Inventors: Sailesh Mansinh Merchant, Orlando, FL (US); Minseok Oh, Orlando, FL (US); Deepak A. Ramappa, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/965,739

(22) Filed: Sep. 28, 2001

(65) Prior Publication Data

US 2003/0064586 A1 Apr. 3, 2003

(51) Int. Cl.[7] .......................... H01L 21/449; B05C 3/05
(52) U.S. Cl. ..................... 438/674; 438/687; 438/913; 118/429
(58) Field of Search ................. 438/674, 687, 438/759, 906, 913; 118/429, 57

(56) References Cited

U.S. PATENT DOCUMENTS

| | | |
|---|---|---|
| 5,847,463 A | 12/1998 | Trivedi |
| 5,865,894 A * | 2/1999 | Vincent ...................... 118/429 |
| 6,165,912 A | 12/2000 | McConnell et al. |
| 6,180,524 B1 | 1/2001 | Ferrell |
| 6,217,735 B1 * | 4/2001 | Vincent ...................... 205/137 |
| 6,319,386 B1 * | 11/2001 | Vincent ...................... 205/148 |
| 6,337,288 B1 * | 1/2002 | Ohya et al. ................. 438/758 |

FOREIGN PATENT DOCUMENTS

| | | | | |
|---|---|---|---|---|
| EP | 1 061 159 A1 * | 12/2000 | ............ | C25D/5/20 |
| JP | 6-256998 A * | 9/1994 | ............ | C25D/21/10 |
| JP | 2000-3886 A * | 1/2000 | ............ | H01L/21/288 |

OTHER PUBLICATIONS

H. Sonoda and T. Kamiya, "Stirring Method of Plating Liquid," JP 6–256998 A, Sep. 1994 (English Translation).*
S. Wolf and R.N. Tauber, *Silicon Processing for VLSI Era, vol. 1—Process Technology*, pp. 134–137, Second Edition (2000), Published by Lattice Press, Sunset Beach, California.

* cited by examiner

Primary Examiner—Carl Whitehead, Jr.
Assistant Examiner—Stephen W. Smoot
(74) Attorney, Agent, or Firm—Robert L. Wolter, Esq.; Beusse Brownlee Bowdoin & Wolter, P.A.

(57) ABSTRACT

A method and apparatus for the electroplating deposition of a metal onto a semiconductor wafer surface (29), including vibrationally scrubbing the wafer surface (29) during an electroplating process. At least one transducer (32) is mounted to a wall (33) of an electroplating tool chamber (22). The transducer (32) intermittently delivers sonic energy pulses lasting for one to two seconds to the electroplating solution during the electroplating process.

23 Claims, 2 Drawing Sheets

METHOD AND APPARATUS FOR CONTROLLING CONTAMINATION DURING THE ELECTROPLATING DEPOSITION OF METALS ONTO A SEMICONDUCTOR WAFER SURFACE

BACKGROUND OF THE INVENTION

This invention relates generally to the fabrication step of electroplating in the manufacture of semiconductor wafers and/or integrated circuit devices (IC devices). In addition, the invention relates to the methods of minimizing particulate contamination occurring during the electroplating process commonly used as a fabrication step of semiconductor wafers and/or IC devices.

Electroplating is widely used for metal deposition in the manufacture of printed circuit boards, and more recently has become popular in the manufacture of IC devices. A variety of conductor materials are used in the interconnect structure of IC devices including aluminum, aluminum alloys, polysilicon with an overlaid metal silicide layer, and tungsten. More recently, copper has been used in IC device fabrication as an interconnect material. A popular method of depositing copper during IC device fabrication is electroplating.

Interconnect structures are those structures on an IC device that connect different levels of a multi-level-interconnect IC device, and include contact holes and/or vias. Contact holes are holes in a PMD (pre-metal dielectric), which is a dielectric layer between a polysilicon gate and a metal layer. Contact holes allow electrical connections between a metal layer and the polysilicon and/or the silicon) wafer substrate. Vias allow the contact between different metal layers on the IC device.

These interconnect materials are deposited on the wafer using different techniques including sputtering, chemical vapor deposition and electroplating. In the case of electroplating copper, a wafer or chip first requires an adhesion/barrier layer and a seed layer. The materials used to form the adhesion/barrier layer, and the methods for application of the adhesion/barrier layer, are known to those skilled in art.

The copper electroplating process of semiconductor wafers and/or IC devices involves the exposure of a wafer; face down, in an electrolyte bath so that the top patterned surface of the wafer is in contact with, or immersed in the electrolyte bath. The electroplating process is performed in an electroplating tool, which is shown in FIG. 1. As shown in FIG. 1, the electroplating tool 11 generally includes an electroplating plating chamber 12 in which a semiconductor wafer 13 is disposed "face-down". Sealing mechanisms, known to those skilled in the art, seal a backside of the wafer 13 from the electroplating process. An electroplating bath (or solution) 15 is supplied to the chamber 12 through a conduit 14. The conduit 14 directs the solution (or bath) to the chamber, so that the wafer is adequately exposed to the electrolytic solution for deposition of copper on the wafer surface.

A commonly used electroplating bath is an electrolyte solution containing copper sulfate, sulfuric acid and water. Moreover, the electrolyte solution includes additives to control the plating process. The additives are organic and inorganic compounds commonly used in the electroplating process that control the rate of copper plating and plating behavior on the wafer surface. The additives are commonly referred to as levelers, brighteners or accelerators.

In an electroplating chamber, the wafer 13 acts as a cathode for copper deposition. The tool 11 is also equipped with a solid copper anode, which replaces copper ions removed as a result of electroplating. The entire electroplating process for a semiconductor wafer may take one to three minutes.

After electroplating, the wafers are then chemically rinsed and dried. In addition, the wafers are annealed to stabilize the copper microstructure formed on the wafer surface. After the annealing step, the wafers are subjected to a chemical-mechanical planarization (CMP) step in which the copper metal deposited on the wafer, outside a via, trench or contact hole, is polished back to leave the features (holes, vias or trenches) filled with copper. The CMP processes available in the production of semiconductor wafers are well known in the art. The CMP process not only removes any excess copper, but also achieves the required planarization across the wafer surface.

Contamination of the wafer may occur in two forms in the electroplating process: particulate contamination and "pits" caused by air/gas bubbles. Since the composition of the electroplating bath is acidic, particles in the bath have a tendency to deposit on the wafer surface during the electroplating process. The presence of particles on the wafer surface leads to enhanced or suppressed copper plating, resulting in the formation of a non-homogenous, defect-ridden copper film across the wafer surface. In addition, as the wafer is placed in the plating cell face down, air bubbles are trapped during the electroplating process against the wafer surface. These air bubbles can lead to "microvoids" or "pits" on the wafer surface. These microvoids or pits compromise the copper film reliability and can lead to device failure.

Present methods used to prevent such contamination include minimizing handling and exposure of wafers in clean rooms, or reducing particulate contamination in a previous step of copper seed deposition. In addition, wafers may be introduced into the electroplating chamber at an angle. However, these methods have proven ineffective. Particulate contamination invariably occurs and cannot by completely eliminated. In addition, the angled introduction of the wafer can lead to a copper thickness gradient across the wafer.

SUMMARY OF THE INVENTION

In order to minimize contamination or prevent defects on semiconductor wafer surfaces or IC devices, an electroplating process is adapted to perform vibrational scrubbing during the electroplating process. An electroplating tool is equipped with a transducer for generating energy waves within an electroplating solution. A top surface of the semiconductor wafer is exposed to the electroplating solution containing those components known in the art such as $Cu_2SO_4$, $H_2SO_4$, water and various organic and inorganic additives to control variables of the electroplating process. During the electroplating process the transducer intermittently generates sonic energy waves at selected frequencies and wavelengths, for a timed duration. The sonic waves agitate and remove particulate contamination and trapped air bubbles. The transducer preferably generates the sonic energy waves for pulses up to 1 to 2 seconds in length. Once the electroplating process is complete, the semiconductor wafers are removed free of contaminants and potential defects that may normally occur in the electroplating process.

DETAILED DESCRIPTION OF THE INVENTION

Figure 1:
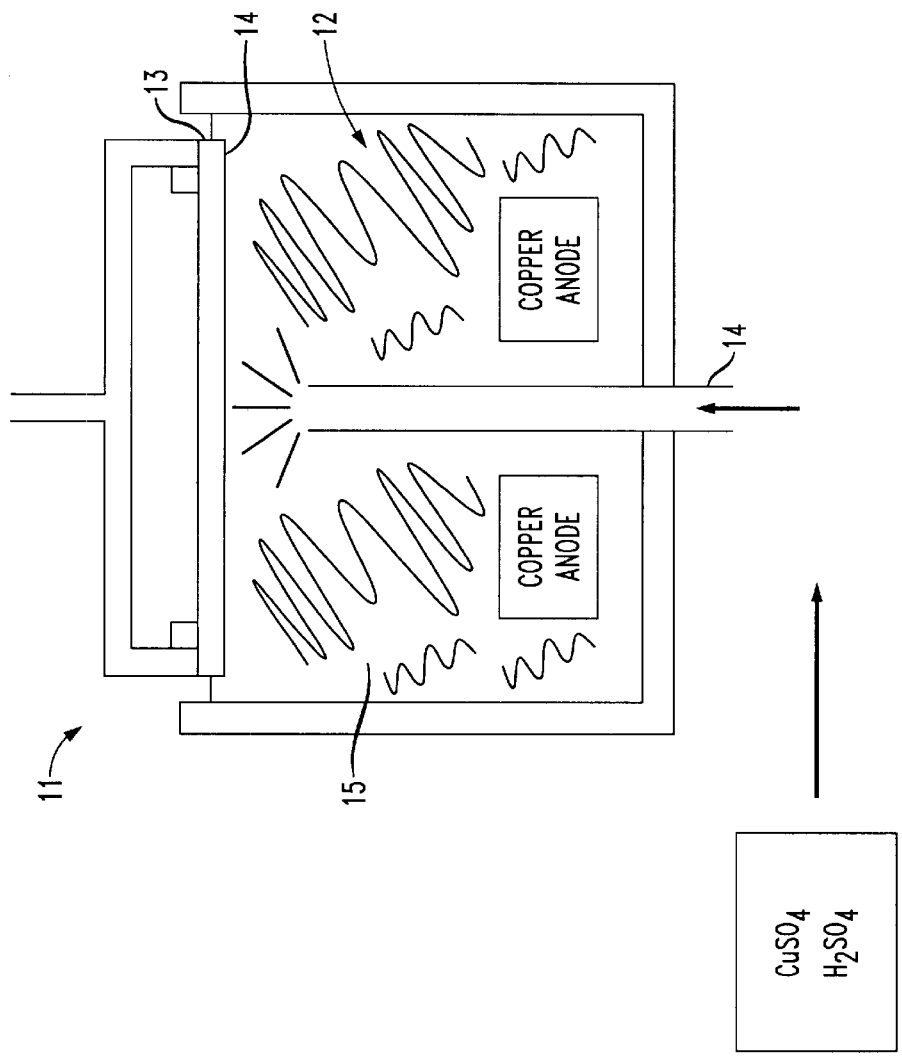
FIG. 1 is a front sectional view of a semiconductor wafers immersed in a electrolyte solution.
Figure 2:
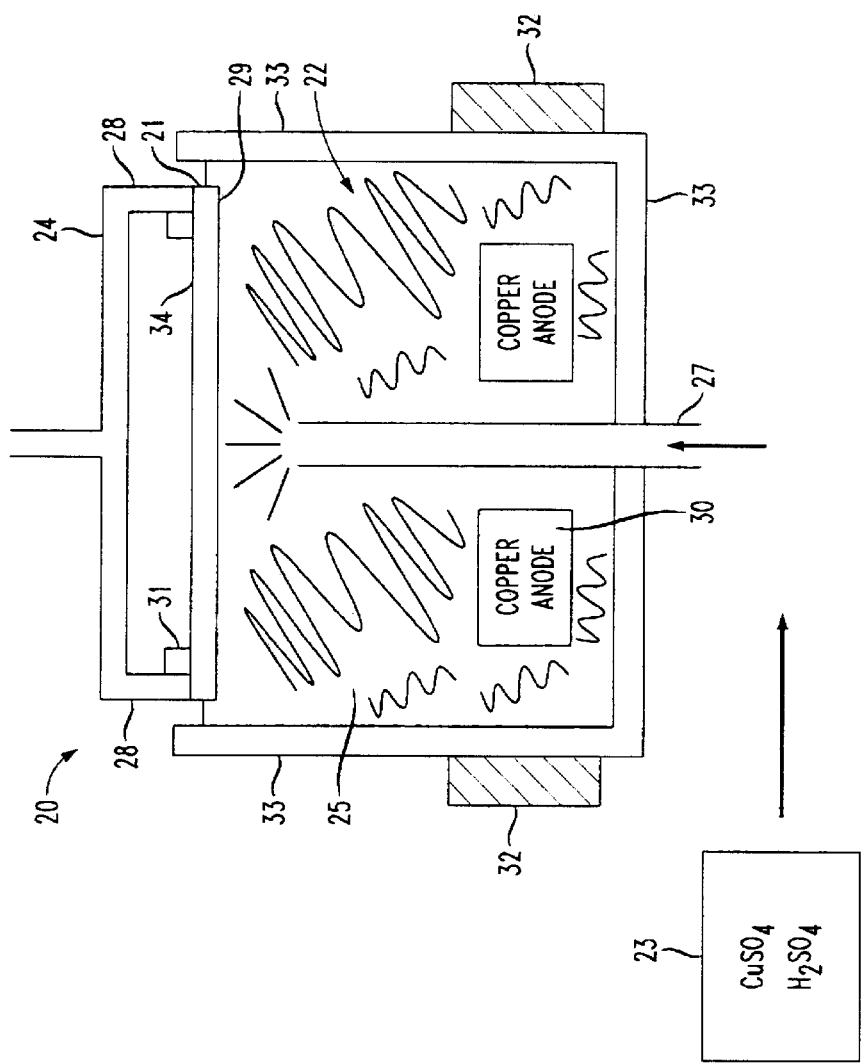
FIG. 2 is a front sectional view of a semiconductor wafer immersed in electroplating tool of the present invention.

The present invention combines the fabrication step of electroplating on a semiconductor wafer surface with a vibrational scrubbing process in order to minimize or eliminate wafer surface contamination that may take place during electroplating. The invention is described in the context of copper electroplating, but the invention is not intended to be limited to copper electroplating but includes the electroplating deposition of other metals as can be appreciated by those skilled in the art. With respect to FIG. 2, an electroplating tool 20 is shown with a semiconductor wafer 21 exposed to a copper-electroplating solution 25 (also referred to as an electrolyte bath or solution). The electroplating solution 25 is held in a chamber 22, which is defined by walls 33. The electrolyte solution 25 consists of an acidic solution of $CuSO_4$ (copper sulfate), $H_2SO_4$ (sulfuric acid), water and organic additives, all of which are known by those skilled in the art. The present invention is not limited by the different components of the bath or the component concentrations.

The semiconductor wafer 21 is secured to a cradle 24 with the top surface of the wafer 21 facing downward toward an electroplating chamber 22 filled with an electrolyte solution 25. The cradle 24 may take different forms as known in the art, but in most cases the cradle 24 is equipped with probe clamps 28 which apply a voltage bias to the wafer surface 29. The voltage bias creates a negative charge along the wafer surface 29 for attraction of positively charged cupric ions in the electrolyte solution 25. The electrolyte solution 25 is supplied from a reservoir 23 to the chamber 22 through a conduit 27.

The cradle 24 immerses the top surface 29 of the wafer 21 in the electrolyte solution 25. The cradle 24 preferably has a sealing mechanism, as an o-ring 31, disposed along a backsurface 34 of the wafer 21, to seal the backsurface 34 from the electroplating process. Copper anodes 30 disposed within the electroplating solution 25 and chamber 22 generate cupric ions replacing those ions removed from the solution by the plating taking place on the wafer surface 29.

A sonic energy source is provided in communication with the electroplating solution. In an exemplary embodiment, at least one transducer 32 is mounted to a wall 33 of the chamber 22. The transducer 32 generates sonic energy in short bursts (sonic energy pulses) of one to two seconds. The sonic energy generated can range from 300 watts to 1200 watts, at frequencies of 800 kHz to 900 kHz of sonic waves to efficiently remove particulate and release trapped air bubbles.

The device may also include means for activating the sonic energy source to supply intermittent bursts of sonic energy to the electroplating solution. In an exemplary embodiment, a variable timing circuit controls the activation and deactivation of the transducer to deliver bursts of sonic energy to the electrolyte solution for preselected time durations. The timer is preferably interconnected with the probes 28 and transducer such that the probe 28 and transducer 32 are simultaneously activated. Alternatively, the timer may delay activation of the transducer 32 for a preselected period of time. In addition, a controller may be incorporated with a timer to program the activation and deactivation of the transducer. The controller is programmed so the transducer 32 is activated intermittently during the electroplating process. The electroplating process takes approximately one to three minutes. Preferably six to eight sonic bursts are generated during the electroplating process so the sonic energy pulses in total last a maximum of twelve to sixteen seconds. Fewer and longer bursts may be generated that are separated by longer periods, e.g., up to eight seconds.

The present invention improves on the prior art of a continuous ultrasonic or megasonic vibration which may cause removal of the additives from the wafer surface 29, which additives are required for effective slope, step and trench coverage. The periodic bursts of sonic energy agitate localized agglomerations, which allows the additives to migrate to and adsorption on the wafer surface 29, and removes contaminants and air/gas bubbles. The pulsing of the transducers may be coupled with a physical movement of the semiconductor wafer in and out of the electrolyte such that the energy is not coupled to the wafer at all times.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

We claim as our invention:

1. A method for controlling contamination during electroplating deposition of a metal onto a semiconductor wafer surface, comprising the steps of:

supplying an electroplating solution to an electroplating chamber;

exposing a semiconductor wafer surface to the electroplating solution for a preselected time duration; and delivering sonic energy to the electroplating solution in intermittent bursts during said predetermined time duration while said semiconductor wafer surface is exposed to the electroplating solution.

2. The method of claim 1 wherein said step of exposing includes immersing the semiconductor wafer surface in the electroplating solution and sealing a backside of the semiconductor wafer from said electroplating solution.

3. The method of claim 1 wherein said burst of sonic energy lasts at least one second.

4. The method of claim 1 wherein said burst of sonic energy lasts no longer than two seconds.

5. The method of claim 1 wherein said electroplating solution contains copper sulfate.

6. The method of claim 1 wherein said step of delivering the sonic energy includes applying said sonic energy within a frequency range of about 800 kHz to 900 kHz.

7. The method of claim 1 wherein said step of delivering the sonic energy includes applying said sonic energy within a power range of about 300 watts to 1200 watts.

8. The method of claim 1 further including the step of separating the bursts of energy a sufficient amount of time to allow additives in the electroplating solution to adsorb on the selected features of the wafer surface during the electroplating process to allow copper to plate onto the selected features.

9. The method of claim 8 wherein said step of separating the bursts of sonic energy includes separating the bursts of sonic energy up to eight seconds between consecutive bursts of energy.

10. The method of claim 1 further including the step of electrically biasing the semiconductor wafer to attract the metal to the wafer surface.

11. The method of claim 1 wherein said step of applying the bursts of sonic energy includes applying the bursts of sonic energy for a total of up to sixteen seconds during the electroplating process.

12. The method of claim 11 further including the step of separating the bursts of sonic energy up to eight seconds between consecutive bursts of energy.

13. A method of controlling contamination during the electroplating deposition of a metal onto a semiconductor wafer surface, comprising the steps of exposing a semiconductor wafer surface to an electroplating solution; initiating an electroplating process of a semiconductor process; and vibrationally scrubbing the wafer during the electroplating process by delivering sonic energy bursts for a preselected time duration to the electroplating solution while said wafer is immersed in the electroplating solution.

14. The method of claim 13 wherein said step of delivering the sonic energy includes delivering the sonic energy bursts in a plurality of preselected time durations during said electroplating process.

15. The method of claim 14 wherein said preselected time durations of sonic energy bursts last at least one second.

16. The method of claim 14 wherein said preselected time durations of sonic energy bursts last no longer than two seconds.

17. The method of claim 13 wherein said method further comprising:
   supplying the electroplating solution to an electroplating chamber,
   immersing the wafer surface in an electroplating solution; and
   sealing a backside of the wafer from the electroplating solution.

18. An apparatus for controlling contamination during the electroplating deposition of a metal onto a semiconductor wafer surface, comprising:

(a) a chamber having a plurality of walls for containing an electroplating solution;

(b) a conduit through which an electroplating solution is supplied to the chamber;

(c) a wafer engagement member adjacent an opening of the chamber;

(d) at least one sonic energy source in communication with said electroplating solution for delivery of sonic energy thereto; and (e) means operationally linked to the sonic energy source, for activating the energy source for a plurality of preselected timed durations during said electroplating process.

19. The apparatus of claim 18 wherein said means for activating the energy source includes a timer operationally linked to the sonic energy source.

20. The apparatus of claim 18 further including a probe for electrically biasing a surface of a semiconductor wafer.

21. The apparatus of claim 20 further including a probe for applying an electrical bias to the wafer and connected to the wafer engagement member and a timer operationally linked to the sonic energy source to simultaneously activate the transducer and the probe.

22. The apparatus of claim 18 wherein said sonic energy source is a transducer mounted to a wall of said chamber.

23. The apparatus of claim 18 wherein said energy source includes at least one transducer mounted to an exterior surface of one of said plurality of walls.

\* \* \* \* \*